US012668705B2

(12) United States Patent (10) Patent No.: US 12,668,705 B2
Jin et al. (45) Date of Patent: Jun. 30, 2026

(54) ORGANIC-INORGANIC ADHESIVE COMPOSITION, AND GAS BARRIER FILM COMPRISING SAME

(71) Applicant: TORAY ADVANCED MATERIALS KOREA INC., Gyeongsangbuk-do (KR)

(72) Inventors: Sang Woo Jin, Gyeongsangbuk-do (KR); Jun Woo Park, Gyeongsangbuk-do (KR)

(73) Assignee: TORAY ADVANCED MATERIALS KOREA INC., Gyeongsangbuk-do (KR)

( * ) Notice: Subject to any disclaimer, the term of this patent is extended or adjusted under 35 U.S.C. 154(b) by 476 days.

(21) Appl. No.: 18/111,261

(22) Filed: Feb. 17, 2023

(65) Prior Publication Data

US 2023/0272223 A1 Aug. 31, 2023

Related U.S. Application Data

(63) Continuation of application No. PCT/KR2020/011065, filed on Aug. 19, 2020.

(51) Int. Cl.
| | |
|---|---|
| *C09D 5/00* | (2006.01) |
| *C08J 7/04* | (2020.01) |
| *C08J 7/043* | (2020.01) |
| *C08J 7/048* | (2020.01) |
| *C09D 4/06* | (2006.01) |

(Continued)

(52) U.S. Cl.
CPC ............ *C09D 5/002* (2013.01); *C08J 7/0423* (2020.01); *C08J 7/043* (2020.01); *C08J 7/048* (2020.01); *C09D 4/06* (2013.01); *C09D*

*133/04* (2013.01); *C09D 175/00* (2013.01); *C23C 16/403* (2013.01); *C23C 16/56* (2013.01);

(Continued)

(58) Field of Classification Search
None
See application file for complete search history.

(56) References Cited

U.S. PATENT DOCUMENTS

| | | | |
|---|---|---|---|
| 9,303,180 B2 | 4/2016 | Yamada et al. | |
| 9,567,498 B2 | 2/2017 | Kim et al. | |

(Continued)

FOREIGN PATENT DOCUMENTS

| | | |
|---|---|---|
| CN | 103289612 | 9/2013 |
| CN | 104140733 | 11/2014 |

(Continued)

OTHER PUBLICATIONS

Extended European Search Report issued in corresponding EP Application No. 20950378.8, issued May 16, 2024, 7 pages.

(Continued)

*Primary Examiner* — Tamra L. Dicus
(74) *Attorney, Agent, or Firm* — Burris Law, PLLC

(57) ABSTRACT

An organic-inorganic adhesive composition and a gas barrier film including the same are disclosed. The organic-inorganic adhesive composition includes: a silane compound including at least one functional group of a vinyl group, an acryloxy group, a methacryloxy group, or a combination thereof; an amine group-containing compound; an isocyanate-based compound; and an acid catalyst, wherein a pH of the organic-inorganic adhesive composition is from 5 to 8.

10 Claims, 2 Drawing Sheets

Figure 1:
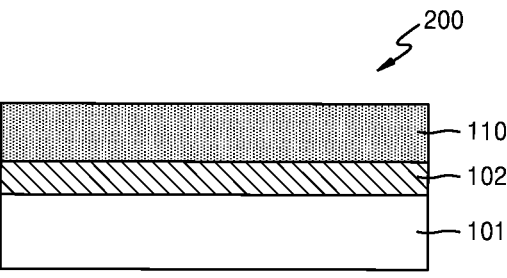

(51) Int. Cl.

| | |
|---|---|
| *C09D 133/04* | (2006.01) |
| *C09D 175/00* | (2006.01) |
| *C23C 16/40* | (2006.01) |
| *C23C 16/56* | (2006.01) |

(52) U.S. Cl.

CPC ........ *C08J 2367/02* (2013.01); *C08J 2433/14* (2013.01); *C08J 2475/00* (2013.01)

(56) References Cited

U.S. PATENT DOCUMENTS

| | | | |
|---|---|---|---|
| 9,745,406 B2 | 8/2017 | Watanabe et al. | |
| 9,914,809 B2 | 3/2018 | Jenkins et al. | |
| 10,882,279 B2 | 1/2021 | Jin et al. | |
| 12,054,567 B2 | 8/2024 | Qiu | |
| 2009/0011256 A1* | 1/2009 | Ito | C09D 183/00 428/447 |
| 2010/0234502 A1 | 9/2010 | Iwasaki et al. | |
| 2016/0145444 A1 | 5/2016 | Qiu | |
| 2019/0016092 A1* | 1/2019 | Jin | B32B 7/12 |
| 2019/0030859 A1 | 1/2019 | Murata et al. | |
| 2019/0039349 A1 | 2/2019 | Shoda et al. | |

FOREIGN PATENT DOCUMENTS

| | | | |
|---|---|---|---|
| CN | 108473818 | | 8/2018 |
| EP | 3401376 A1 | | 11/2018 |
| JP | S6348363 A | | 3/1988 |
| JP | H08152736 A | | 6/1996 |
| JP | 2005301208 A | | 10/2005 |
| JP | 2012030484 A | | 2/2012 |
| JP | 2012223919 A | | 11/2012 |
| JP | 2014166753 A | | 9/2014 |
| JP | 5705006 B2 | * | 4/2015 |
| JP | 2016534220 A | | 11/2016 |
| JP | 2019506483 A | | 3/2019 |
| KR | 1020100103411 A | | 9/2010 |
| KR | 1020110114654 A | | 10/2011 |
| KR | 1020150107397 A | | 9/2015 |
| KR | 1020160065407 A | | 6/2016 |
| KR | 1020160097829 A | | 8/2016 |
| KR | 101721397 B1 | * | 2/2017 |
| KR | 1020170083336 A | | 7/2017 |
| KR | 20170096883 | | 8/2017 |
| KR | 101829968 B1 | | 2/2018 |
| KR | 1020180132667 A | | 12/2018 |
| KR | 1020180134361 A | | 12/2018 |
| KR | 102008182 B1 | * | 8/2019 ........... C08F 220/18 |

OTHER PUBLICATIONS

Office Action issued in corresponding JP Application No. 2023-511849, dated Aug. 19, 2024 and English translation thereof, 7 pages.

International Search Report and Written Opinion issued in corresponding International Application No. PCT/KR2020/011065, mailed May 13, 2021, and an English Translation, 9 pages.

Office Action issued in corresponding KR Application No. 10-2019-0095101, issued Oct. 15, 2020, 5 pages.

Notice of Allowance issued in corresponding KR Application No. 10-2019-0095101, issued Jan. 26, 2021, 2 pages.

Office Action issued in corresponding CN Application No. 2020801031693, dated Nov. 7, 2024 and English translation thereof, 12 pages.

* cited by examiner

ORGANIC-INORGANIC ADHESIVE COMPOSITION, AND GAS BARRIER FILM COMPRISING SAME

CROSS-REFERENCE TO RELATED APPLICATION

This application is a continuation of International Application No. PCT/KR2020/011065, filed on Aug. 19, 2020. The disclosure of the above application is incorporated herein by reference.

FIELD

The present disclosure relates to an organic-inorganic adhesive composition and a gas barrier film including the same.

BACKGROUND

The statements in this section merely provide background information related to the present disclosure and may not constitute prior art.

With the development of display technologies, there is an increasing need for gas barrier films.

As gas barrier films require high gas barrier properties, the films are mainly formed to have a multi-layer structure by alternately laminating an organic layer and an inorganic layer on a flexible film substrate. In such a multi-layer gas barrier film, the inorganic layer mainly serves as a gas barrier layer, and the organic layer performs functions of: planarizing a surface of a layer on which the inorganic layer is to be laminated; improving adhesion between a substrate and the inorganic layer; and improving gas barrier properties of the inorganic layer by filling defective portions such as crack, pinholes, or the like.

However, the multi-layer gas barrier film enables the achievement of a desired level of gas barrier properties by adjusting the number of inorganic layers and organic layers. However, as the number of layers increases, transparency is reduced, and internal cracks may be caused by a difference in thermal expansion coefficient due to an increase in layer thickness, and production costs increase as a production yield rate is reduced.

Accordingly, there is a need for a composition for forming a novel functional layer in a gas barrier film and a gas barrier film including the same.

SUMMARY

This section provides a general summary of the disclosure and is not a comprehensive disclosure of its full scope or all of its features.

According to an aspect, an organic-inorganic adhesive composition capable of mutually adhesive with an inorganic material gas barrier layer and various organic material layers constituting a device, improving gas barrier properties, and high-speed curing at a low temperature of 100° C. or less is provided.

According to another aspect, a gas barrier film including the organic-inorganic adhesive composition is provided.

According to an aspect, an organic-inorganic adhesive composition may include: a silane compound including at least one functional group of a vinyl group, an acryloxy group, a methacryloxy group, or a combination thereof; an amine group-containing compound; an isocyanate-based compound; and an acid catalyst; wherein a pH of the organic-inorganic adhesive composition is from 5 to 8.

The amine group-containing compound may increase the pH of the organic-inorganic adhesive composition from 2 to 6.

The organic-inorganic adhesive composition has a change in pH of 0.5 or less for 48 hours.

The silane compound may include a $C_1$-$C_{10}$ alkoxy silane compound.

The organic-inorganic adhesive composition may further include a silane compound having an epoxy group.

A weight ratio of the silane compound having an epoxy group to the silane compound including at least one functional group of a vinyl group, an acryloxy group, a methacryloxy group, or a combination thereof may be from 1:1 to 1:100.

A content of the silane compound may be from 0.01 percent by weight (wt %) to 10 wt %, based on a total weight of the organic-inorganic adhesive composition.

The organic-inorganic adhesive composition may be cured within 2 minutes at a temperature of 100° C. or less.

According to another aspect, a gas barrier film is provided, which includes a substrate, an inorganic material gas barrier layer disposed on at least one surface of the substrate, and an organic-inorganic adhesive layer, which is a cured layer derived from the organic-inorganic adhesive composition, on one surface of the inorganic material gas barrier layer.

An organic material layer may be further included on one surface of the organic-inorganic adhesive layer.

The organic-inorganic adhesive layer may form a radical bond with the organic material layer.

A thickness of the organic-inorganic adhesive layer may be from 0.01 micrometers (μm) to 10 um.

The gas barrier film may reduce a water vapor transmission rate by 10% or more, as compared with a gas barrier film that may not contain an organic-inorganic adhesive layer.

An organic-inorganic adhesive composition according to an aspect may be capable of mutually adhesive with an inorganic material gas barrier layer and various organic material layers constituting a device, improving gas barrier properties, and high-speed curing at a low temperature of 100° C. or less. A gas barrier film according to another aspect may have improved gas barrier characteristics, high transparency, and a reduced water vapor transmission rate by including the organic-inorganic adhesive composition.

Further areas of applicability will become apparent from the description provided herein. It should be understood that the description and specific examples are intended for purposes of illustration only and are not intended to limit the scope of the present disclosure.

DRAWINGS

Figure 2:
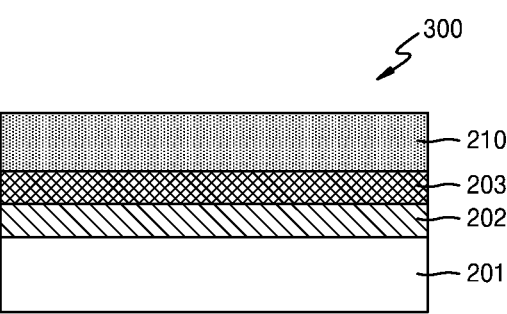

In order that the disclosure may be well understood, there will now be described various forms thereof, given by way of example, reference being made to the accompanying drawings, in which:

FIG. 1 is a cross-sectional view of a gas barrier film according to an embodiment; and FIG. 2 is a cross-sectional view of a gas barrier film according to another embodiment.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Hereinafter, an organic-inorganic adhesive composition and a method for preparing a gas barrier film including the organic-inorganic adhesive composition will be described in detail with reference to Examples and drawings of the disclosure. The Examples are for illustrative purposes only, and it will be apparent to one of ordinary skill in the art that the scope of the disclosure is not construed as being limited by these examples.

Unless otherwise defined, all technical and scientific terms used in this specification have the same meaning as commonly understood by one of ordinary skill in the art to which the disclosure belongs. When terms used herein are in conflict, definitions included in the present specification including will be ahead. Similar or equivalent methods and materials described herein may be used for the implementation or testing of the disclosure, but suitable methods and materials are described herein.

It will be further understood that the terms "comprises" and/or "comprising" used herein specify the presence of stated features or components, and they do not preclude the presence of one or more other features or components but add the presence thereof.

The term "and/or" as used herein is construed as including any and all combinations of at least one of the related recited items. The term "or" as used herein means "and/or". In the present specification, the expression "at least one" or "one or more" before the components may supplement the list of all components, and the expression may not mean that the individual components of the description may be supplemented.

The term "-based photoinitiator" as used herein means to include all "-photoinitiator or a derivative thereof".

An organic-inorganic adhesive composition may include a silane compound including at least one functional group of a vinyl group, an acryloxy group, a methacryloxy group, or a combination thereof; an amine group-containing compound; an isocyanate-based compound; and an acid catalyst, wherein a pH of the organic-inorganic adhesive composition is from 5 to 8.

The organic-inorganic adhesive composition may be capable of mutually adhesive with an inorganic material gas barrier layer and various organic material layers constituting a device, improving gas barrier properties, and high-speed curing at a low temperature of 100° C. or less.

As the silane compound including at least one functional group of a vinyl group, an acryloxy group, a methacryloxy group, or a combination thereof may include a double bond, through UV curing, radical bonds may be formed with radically polymerizable organic compounds of other layers. Accordingly, the organic material layer and the inorganic material gas barrier layer may be interconnected.

The silane compound may include a $C_1$-$C_{10}$ alkoxy silane compound.

The $C_1$-$C_{10}$ alkoxy silane compound may include an alkoxy group capable of forming a hydroxy group through hydrolysis. The hydroxy group formed through such hydrolysis may form a mutual chemical bond through a condensation reaction with a hydroxy group of the inorganic material gas barrier layer.

For example, the silane compound including at least one functional group of a vinyl group, an acryloxy group, a methacryloxy group, or a combination thereof may include vinyltrimethoxy silane, vinyltriethoxy silane, 3-methacryloxypropyl methyldimethoxy silane, 3-methacryloxypropyl trimethoxy silane, 3-methacryloxypropyl methyldiethoxy silane, 3-methacryloxypropyl, 3-acryloxypropyl trimethoxy silane, or a combination thereof.

The silane compound including at least one functional group of a vinyl group, an acryloxy group, a methacryloxy group, or a combination thereof may be in the form of a monomer or in the form of an oligomer or polymer.

The organic-inorganic adhesive composition may further include a silane compound having an epoxy group. The epoxy group may be one or two or more.

The silane compound having an epoxy group may form a mutual chemical bond through an epoxy reaction with a hydroxy group of the inorganic material gas barrier layer.

The epoxy group may include a glycidyl group, a glycidoxy group, or an epoxidized $C_4$-$C_{20}$ cycloalkyl group, or a combination thereof. However, embodiments are not limited thereto. epoxy groups of various shapes as needed may also be included.

For example, the silane compound having an epoxy group may include 2-(3,4 epoxycyclohexyl) ethyltrimethoxy silane, 3-glycidoxy propyl methyldimethoxy silane, 3-glycidoxy propyl trimethoxy silane, 3-glycidoxy propyl methyldiethoxy silane, 3-glycidoxy propyl triethoxy silane, or a combination thereof.

The $C_1$-$C_{10}$ alkoxy silane compound having an epoxy group may be in the form of a monomer or in the form of an oligomer or polymer.

A weight ratio of the silane compound having an epoxy group to the silane compound including at least one functional group of a vinyl group, an acryloxy group, a methacryloxy group, or a combination thereof may be from 1:1 to 1:100, for example, 1:1 to 1:80, for example, 1:1 to 1:50, for example, 1:1 to 1:30, or for example, 1:1 to 1:10.

When a weight ratio of the silane compound having an epoxy group to the silane compound including at least one functional group of a vinyl group, an acryloxy group, a methacryloxy group, or a combination thereof exceeds 1:100, adhesive force with the inorganic material gas barrier layer may be reduced due to addition of the silane compound having an epoxy group.

A content of the silane compound including at least one functional group of a vinyl group, an acryloxy group, a methacryloxy group, or a combination thereof may be from 0.01 wt % to 10 wt %, for example, 0.03 wt % to 10 wt %, for example, 0.05 wt % to 10 wt %, for example, 0.08 wt % to 10 wt %, or for example, 1 wt % to 10 wt %, based on the total weight of the organic-inorganic adhesive composition total weight.

When a content of the silane compound including at least one functional group of a vinyl group, an acryloxy group, a methacryloxy group, or a combination thereof is less than 0.01 wt %, as the organic-inorganic adhesive layer is formed thin, the adhesive force between the organic material layer and the inorganic material gas barrier layer may be lowered, and it may be difficult to protect the inorganic material gas barrier layer from the outside. In addition, defects such as cracks or pinholes of the inorganic material gas barrier layer may not be sufficiently filled, and thus gas barrier characteristics may deteriorate.

When a content of the silane compound including at least one functional group of a vinyl group, an acryloxy group, a methacryloxy group, or a combination thereof is greater than 10 wt %, as the organic-inorganic adhesive layer is formed thick, curl may be generated on the gas barrier film due to a difference in thermal expansion coefficient with the inorganic material gas barrier layer or the substrate film, and the flexibility of the gas barrier film may decrease due to the thick adhesive layer.

The amine group-containing compound may be in the form of a monomer having an amine group, or may be in the form of an oligomer or polymer.

The amine group-containing compound may include an amine group-containing silane compound.

Examples of the amine group-containing compound may include n-2-(aminoethyl)-3-aminopropylmethyldimethoxy silane, n-2-(aminoethyl)-3-aminopropyltriethoxy silane, 3-aminopropyltrimethoxy silane, 3-aminopropyltriethoxy silane, 3-triethoxysilyl-N-(1,3 dimethyl-butylidene)propylamine, N-phenyl-3-aminopropyltrimethoxy silane, or a combination thereof.

In addition, the amine group-containing compound may include isopropylamine, isobutylamine, isopentylamine, isoheptylamine, or a combination thereof.

The amine group-containing compound may improve a condensation reaction between a hydroxy group of the silane compound, e.g., an alkoxy silane compound, including at least one functional group of a vinyl group, an acryloxy group, a methacryloxy group, or a combination thereof, and a hydroxy group of the inorganic material gas barrier layer, and a condensation reaction between the silane compounds including at least one functional group of a vinyl group, an acryloxy group, a methacryloxy group, or a combination thereof, formed by hydrolysis by increasing pH of the organic-inorganic adhesive composition to basicity.

The amine group-containing compound may increase the pH of the organic-inorganic adhesive composition from 2 to 6. For example, the amine group-containing compound may increase the pH of the organic-inorganic adhesive composition from 2 to 5.

When the amine group-containing compound induces the pH of the organic-inorganic adhesive composition to be greater than 6, a condensation reaction between the silane compounds including at least one functional group of a vinyl group, an acryloxy group, a methacryloxy group, or a combination thereof may occur too rapidly, and thus, gelation of the silane compound including at least one functional group of a vinyl group, an acryloxy group, a methacryloxy group, or a combination thereof in the solution may occur over time.

The isocyanate-based compound may include a monomer, oligomer, polymer, or a derivative thereof, each having an isocyanate group.

For example, the isocyanate-based oligomer or polymer may react with the silane compound including at least one functional group of a vinyl group, an acryloxy group, a methacryloxy group, or a combination thereof or the amine group-containing compound to form a crosslinking chemical bond. The crosslinking chemical bond formed may further strengthen the bonding force between the organic material layer and the inorganic material gas barrier layer.

The acid catalyst may include hydrochlorate, nitrate, sulfate, formate, or acetate. However, embodiments are not limited thereto, and the acid catalyst may include each of these alone or two or more. The acid catalyst may reduce the pH of the organic-inorganic adhesive composition to acidity to promote hydrolysis of the alkoxy group of the silane compound including at least one functional group of a vinyl group, an acryloxy group, a methacryloxy group, or a combination thereof, e.g., an alkoxy silane compound. The pH of the composition including the silane compound including at least one functional group of a vinyl group, an acryloxy group, a methacryloxy group, or a combination thereof and the acid catalyst may be 5 or less, or for example, 4 or less.

The pH of the organic-inorganic adhesive composition may be from 5 to 8, for example, 6 to 8.

When the pH of the organic-inorganic adhesive composition is less than 5, a condensation reaction between a hydroxy group of the silane compound including at least one functional group of a vinyl group, an acryloxy group, a methacryloxy group, or a combination thereof, e.g., an alkoxy silane compound, and a hydroxy group of the inorganic material gas barrier layer may be deteriorated, and reaction times may be long, or high reaction energies may be required. As a result, an increase in the price of the gas barrier film or defects in the appearance of the gas barrier film such as thermal wrinkles may occur.

When the pH of the organic-inorganic adhesive composition is greater than 8, a condensation reaction between the silane compounds including at least one functional group of a vinyl group, an acryloxy group, a methacryloxy group, or a combination thereof, e.g., a hydroxy group of the alkoxy silane compound, and a hydroxy group of the inorganic material gas barrier layer may be improved, however, at the same time, a condensation reaction between the silane compounds including at least one functional group of a vinyl group, an acryloxy group, a methacryloxy group, or a combination thereof may also be improved, and thus, gelation of the silane compound in the solution may occur over time.

The organic-inorganic adhesive composition has a change in pH of 0.5 or less for 48 hours. For example, the organic-inorganic adhesive composition may have a change in pH of 0.4 or less, or for example, 0.3 or less for 48 hours. Accordingly, the reactivity of the silane compound including at least one functional group of a vinyl group, an acryloxy group, a methacryloxy group, or a combination thereof of the organic-inorganic adhesive composition may be maintained constant.

The organic-inorganic adhesive composition may further include, as needed, a monomer, an oligomer, or a polymer, each including a functional group such as a hydroxy group, a carboxyl group, an amide group, an urea group, or a thiol group.

The organic-inorganic adhesive composition may include at least one organic solvent. Examples of the organic solvent include alcohol, ketone, ether, toluene, hexane, or a benzene, but are not limited thereto.

The organic-inorganic adhesive composition may be cured within 2 minutes, for example, within 1 minute, at a temperature of 100° C. or less.

When the curing temperature of the organic-inorganic adhesive composition exceeds 100° C., thermal shock is applied to the gas barrier film, which may cause defects in the appearance of the gas barrier film such as thermal wrinkles. When the curing time of the organic-inorganic adhesive composition exceeds 2 minutes, the productivity of the gas barrier film may be lowered, and price competitiveness may deteriorate, and thermal shock may be applied to the gas barrier film.

As such, the organic-inorganic adhesive composition requires low-temperature high-speed curing. Thus, when necessary, a UV curing process may be added to evaporate the solvent of the organic-inorganic adhesive composition at a low temperature, and then the thermal shock applied to the gas barrier film can be reduced by curing through UV curing.

The organic-inorganic adhesive composition may further include at least one radical bonding compound and photoinitiator.

Examples of the radical bonding compound include (meth)acrylate, (meth)acrylamide, maleimide, (meth)acrylic acid, maleic acid, itaconic acid, (meth)acrylaldehyde, (meth)acryloylmorpholine, N-vinyl-2-pyrrolidone, or triallylisocyanurate, or the like, each having at least one (meth) acryloyl group in the molecule, but is not limited thereto.

Examples of the photoinitiator include an acetophenone-based photoinitiator, a benzoin ether-based photoinitiator, a benzophenone-based photoinitiator, or a thioxanthone-based photoinitiator, but is not limited thereto.

A gas barrier film according to one or more embodiments may include: a substrate; an inorganic material gas barrier layer disposed on at least one surface of the substrate; and an organic-inorganic adhesive layer, which is a cured layer derived from the organic-inorganic adhesive composition, on one surface of the inorganic material gas barrier layer.

FIG. 1 is a cross-sectional view of a gas barrier film 200 according to an embodiment.

As shown in FIG. 1, in the gas barrier film 200, a substrate 101, an inorganic material gas barrier layer 102, and an organic-inorganic adhesive layer 110 which is a cured layer derived from the organic-inorganic adhesive composition may be sequentially stacked.

The gas barrier film 200 may have improved gas barrier characteristics, high transparency, and a reduced water vapor transmission rate by including the organic-inorganic adhesive composition.

The substrate 101 may be a transparent substrate, for example, a transparent flexible polymer substrate film. Examples of the transparent flexible polymer substrate film include polyethylene terephthalate, polyethylene naphthalate, poly aryllate, polycarbonate, polyetherimide, polyamideimide, polyimide, or polybenzoxazole. However, embodiments are not limited thereto. Any transparent flexible polymer substrate film available in the art may also be included. The substrate 101 may be a single layer or have a multilayer structure of two or more layers.

The inorganic material gas barrier layer 102 may be formed from a material of metal, metal oxide, metal nitride, metal carbide, or a combination thereof. The inorganic material gas barrier layer 102 may be, for example, at least one metal selected from Si, Al, Ti, Zr and Ta, an oxide, a nitride, or a combination thereof of the metal. The inorganic material gas barrier layer 102 may be, for example, silicon oxide or aluminum oxide. However, embodiments are not limited thereto.

The inorganic material gas barrier layer 102 may have a thickness of 5 nm to 200 nm, or for example, 5 nm to 100 nm. The inorganic material gas barrier layer 102 may improve optical characteristics, flexibility, and gas barrier characteristics within the thickness range.

The organic-inorganic adhesive layer 110 may have a thickness of 0.01 μm to 10 μm, for example, 0.05 μm to 10 μm, or for example, 0.05 μm to 5 μm.

When the thickness of the organic-inorganic adhesive layer 110 is less than 0.01 μm, the organic-inorganic adhesive force may be insufficient, separation between layers may occur in the organic material layer or inorganic material gas barrier layer 102, and the organic-inorganic adhesive force may not sufficiently compensate for defects such as cracks or pinholes in the inorganic material gas barrier layer 102, resulting in deterioration of gas barrier properties.

When the thickness of the organic-inorganic adhesive layer 110 exceeds 10 μm, curl may occur in the gas barrier film 200 due to the difference in thermal expansion coefficient with the inorganic material gas barrier layer 102 or substrate 101, and thus, the flexibility of the gas barrier film 200 may be reduced due to the thick adhesive layer.

An organic material layer may be further included on one surface of the organic-inorganic adhesive layer 110. The organic material layer may be, for example, a UV curable acrylic coating layer. However, embodiments are not limited thereto. The organic material layer may be any coating layer containing an organic material available in the art.

The organic-inorganic adhesive layer 110 contains a double bond and may form a radical bond with the organic material layer.

The gas barrier film 200 may reduce a water vapor transmission rate by 10% or more, as compared with a gas barrier film that may not contain an organic-inorganic adhesive layer.

The water vapor transmission rate of the gas barrier film 200 in which the organic-inorganic adhesive layer 110 is stacked may be, for example, $0.05 \text{ g/m}^2$ day or less. The organic-inorganic adhesive composition may improve gas barrier properties by filling defects such as pinholes or cracks in the inorganic material gas barrier layer 102.

FIG. 2 is a cross-sectional view of a gas barrier film 300 according to another embodiment.

As shown in FIG. 2, in the gas barrier film 300, a substrate 201, an inorganic material gas barrier layer 202, a protective layer 203, and an organic-inorganic adhesive layer 210 may be sequentially stacked. The protective layer 203 may be a layer formed by an organic material or by mixing an organic material and an inorganic material to protect the inorganic material gas barrier layer 202 from the outside.

For example, the protective layer 203 may include a silane compound. For example, the protective layer 203 may have a hydroxy group on a surface thereof due to the organic material or the silane compound. As the organic-inorganic adhesive layer 210 may form a chemical bond with the hydroxy group of the protective layer 203, adhesion with to the inorganic material gas barrier layer 202 as well as the protective layer 203 may be possible.

A method of preparing a gas barrier film according to one or more embodiments may include: preparing a substrate; forming an inorganic material gas barrier layer on at least one surface of the substrate; and printing or coating the organic-inorganic adhesive composition on one surface of the inorganic material gas barrier layer to form an organic-inorganic adhesive layer. The method of preparing a gas barrier film may provide a gas barrier film with improved gas barrier properties, high transparency, and a reduced water vapor transmission rate.

In the forming of the inorganic material gas barrier layer, a sputtering method, an electron beam evaporation method, a chemical vapor deposition (CVD) method, a plasma enhanced chemical vapor deposition method, or a plating method may be used. For example, in the forming of the inorganic material gas barrier layer, a sputtering method, an electron beam evaporation method, or a CVD method may be used.

Hereinafter, the disclosure and the resulting effects will be described in more detail with reference to Examples and Comparative Examples. However, these Examples are for illustrative purposes only, and the scope of the disclosure is not intended to be limited by these Examples.

EXAMPLES

Example 1: Preparation of Gas Barrier Film

As a transparent substrate, a polyethylene terephthalate (PET) film (PH8, thickness of 75 μm) was used. An inorganic material gas barrier layer was formed by stacking an aluminum oxide (Al$_2$O$_3$) film having a thickness of 30 nm on a top surface of the PET film by CVD.

Separately, an organic-inorganic adhesive composition was prepared in the following manner.

15 g of 3-methacryloxypropyl trimethoxy silane (Shin-Etsu, KBM-503) was added to a solvent in which 51 g of isopropyl alcohol (IPA) and 17 g of deionized water (DAEJUNG CHEMICALS & METALS) were mixed. Then, using hydrochloric acid as an acid catalyst in the 3-methacryloxypropyl trimethoxy silane-containing solution, the pH of the solution was adjusted to 3.0 with a pH meter (Thermo Scientific, Orion 3-Star), followed by stirring at 150 rpm for 1 hour to prepare a first mixed solution. Then, after mixing 267 g of isopropyl alcohol and 5 g of deionized water in the first mixed solution, a second mixed solution was prepared by adding 225 g of a diluted solution obtained by diluting polyisocyanate (Samwon, CAT-45) in an isopropyl alcohol solvent at a weight ratio of 1:5 and stirring at 150 rpm for 10 minutes. Then, 3-aminopropyltrimethoxy silane (Shin-Etsu, KBM-903) was added to the second mixed solution so that the pH of the solution was 8.0 using a pH meter (Thermo Scientific, Orion 3-Star), followed by stirring at 150 rpm for 10 minutes, thus preparing an organic-inorganic adhesive composition.

The organic-inorganic adhesive composition was bar-coated on the top surface of the inorganic material gas barrier layer and cured at 100° C. for 1 minute at high speed to form an organic-inorganic adhesive layer having a thickness of 0.3 μm to thereby prepare a gas barrier film.

Example 2: Preparation of Gas Barrier Film

A gas barrier film was prepared in the same manner as in Example 1, except that 3-am inopropyltrimethoxy silane (Shin-Etsu, KBM-903) was added to the second mixed solution so that the pH of the solution was 5.5 instead of 8.0 using a pH meter (Thermo Scientific, Orion 3-Star), followed by stirring at 150 rpm for 10 minutes, to prepare the organic-inorganic adhesive composition.

Example 3: Preparation of Gas Barrier Film

A gas barrier film was prepared in the same manner as in Example 1, except that isopentylamine (Sigma-Aldrich) was added to the second mixed solution instead of 3-aminopropyltrimethoxy silane (Shin-Etsu, KBM-903) so that the pH of the solution was 8.0 using a pH meter (Thermo Scientific, Orion 3-Star).

Example 4: Preparation of Gas Barrier Film

A gas barrier film was prepared in the same manner as in Example 1, except that 15 g of a silane oligomer (Shin-Etsu, KR-513) having an acryloxy group and a methacryloxy group was added instead of a solvent in which 51 g of IPA and 17 g of deionized water (DAEJUNG CHEMICALS & METALS) were added to 15 g of 3-methacryloxypropyl trimethoxy silane (Shin-Etsu, KBM-503).

Example 5: Preparation of Gas Barrier Film

A gas barrier film was prepared in the same manner as in Example 1, except that 15 g of a mixture of 3-glycidoxypropyl trimethoxy silane (Shin-Etsu, KBM-403) and 3-methacryloxypropyl trimethoxy silane (Shin-Etsu, KBM-503) at a weight ratio of 1:3 was added instead of a solvent in which 51 g of IPA and 17 g of deionized water (DAEJUNG CHEMICALS & METALS) were added to 15 g of 3-methacryloxypropyl trimethoxy silane (Shin-Etsu, KBM-503), and hydrochloric acid was used as an acid catalyst in a mixed solution containing 3-glycidoxypropyl trimethoxy silane and 3-methacryloxypropyl trimethoxy silane.

Example 6: Preparation of Gas Barrier Film

A gas barrier film was prepared in the same manner as in Example 1, except that the organic-inorganic adhesive composition left for 48 hours at room temperature was bar-coated on the top surface of the inorganic material gas barrier layer and cured at 100° C. for 1 minute at high speed to form an organic-inorganic adhesive layer having a thickness of 0.3 μm.

Example 7: Preparation of Gas Barrier Film

A gas barrier film was prepared in the same manner as in Example 1, except that 3-am inopropyltrimethoxy silane (Shin-Etsu, KBM-903) was added to the second mixed solution so that the pH of the solution was 5.5 instead of 8.0 using a pH meter (Thermo Scientific, Orion 3-Star), followed by stirring at 150 rpm for 10 minutes to prepare the organic-inorganic composition, and the organic-inorganic adhesive composition left for 48 hours at room temperature was bar-coated on the top surface of the inorganic material gas barrier layer and cured at 100° C. for 1 minute at high speed to form an organic-inorganic adhesive layer having a thickness of 0.3 μm.

Example 8: Preparation of Gas Barrier Film

A gas barrier film was prepared in the same manner as in Example 1, except that 15 g of a mixture of 3-glycidoxypropyl trimethoxy silane (Shin-Etsu, KBM-403) and 3-methacryloxypropyl trimethoxy silane (Shin-Etsu, KBM-503) at a weight ratio of 1:3 was added instead of a solvent in which 51 g of IPA and 17 g of deionized water (DAEJUNG CHEMICALS & METALS) were added to 15 g of 3-methacryloxypropyl trimethoxy silane (Shin-Etsu, KBM-503), hydrochloric acid was used as an acid catalyst in a mixed solution containing 3-glycidoxypropyl trimethoxy silane and 3-methacryloxypropyl trimethoxy silane, and the thus prepared organic-inorganic adhesive composition was left for 48 hours at room temperature and was bar-coated on the top surface of the inorganic material gas barrier layer and cured at 100° C. for 1 minute at high speed to form an organic-inorganic adhesive layer having a thickness of 0.3 μm.

Comparative Example 1: Preparation of Gas Barrier Film

A gas barrier film was prepared in the same manner as in Example 1, except that an organic-inorganic adhesive layer was not formed on the top of the inorganic material gas barrier layer.

Comparative Example 2: Preparation of Gas Barrier Film

A gas barrier film was prepared in the same manner as in Example 1, except that an organic-inorganic adhesive composition not added with 3-aminopropyltrimethoxy silane (Shin-Etsu, KBM-903) was used.

Comparative Example 3: Preparation of Gas Barrier Film

A gas barrier film was prepared in the same manner as in Example 1, except that hydrochloric acid was used as an acid catalyst in the 3-methacryloxypropyl trimethoxy silane-containing solution, the pH of the solution was adjusted to 5.0 instead of 3.0 with a pH meter (Thermo Scientific, Orion 3-Star), followed by stirring at 150 rpm for 1 hour to prepare a first mixed solution, and the second mixed solution was not added with 3-aminopropyltrimethoxy silane (Shin-Etsu, KBM-903).

Comparative Example 4: Preparation of Gas Barrier Film

A gas barrier film was prepared in the same manner as in Example 1, except that 3-am inopropyltrimethoxy silane (Shin-Etsu, KBM-903) was added to the second mixed solution so that the pH of the solution was 4.5 instead of 8.0 using a pH meter (Thermo Scientific, Orion 3-Star), followed by stirring at 150 rpm for 10 minutes, to prepare the organic-inorganic adhesive composition.

Comparative Example 5: Preparation of Gas Barrier Film

A gas barrier film was prepared in the same manner as in Example 1, except that 3-am inopropyltrimethoxy silane (Shin-Etsu, KBM-903) was added to the second mixed solution so that the pH of the solution was 9.5 instead of 8.0 using a pH meter (Thermo Scientific, Orion 3-Star), followed by stirring at 150 rpm for 10 minutes, to prepare the organic-inorganic adhesive composition.

Comparative Example 6: Preparation of Gas Barrier Film

A gas barrier film was prepared in the same manner as in Example 1, except that hydrochloric acid was used as an acid catalyst in the 3-methacryloxypropyl trimethoxy silane-containing solution, the pH of the solution was adjusted to 5.0 instead of 3.0 with a pH meter (Thermo Scientific, Orion 3-Star), followed by stirring at 150 rpm for 1 hour to prepare a first mixed solution, and the second mixed solution was not added with 3-aminopropyltrimethoxy silane (Shin-Etsu, KBM-903) to prepare an organic-inorganic adhesive composition, and the organic-inorganic adhesive composition was left for 48 hours at room temperature and was bar-coated on the top surface of the inorganic material gas barrier layer and cured at 100° C. for 1 minute at high speed to form an organic-inorganic adhesive layer having a thickness of 0.3 μm.

Comparative Example 7: Preparation of Gas Barrier Film

A gas barrier film was prepared in the same manner as in Example 1, except that 3-am inopropyltrimethoxy silane (Shin-Etsu, KBM-903) was added to the second mixed solution so that the pH of the solution was 4.5 instead of 8.0 using a pH meter (Thermo Scientific, Orion 3-Star), followed by stirring at 150 rpm for 10 minutes to prepare the organic-inorganic composition, and the organic-inorganic adhesive composition was left for 48 hours at room temperature and was bar-coated on the top surface of the inorganic material gas barrier layer and cured at 100° C. for 1 minute at high speed to form an organic-inorganic adhesive layer having a thickness of 0.3 μm.

Comparative Example 8: Preparation of Gas Barrier Film

A gas barrier film was prepared in the same manner as in Example 1, except that 3-am inopropyltrimethoxy silane (Shin-Etsu, KBM-903) was added to the second mixed solution so that the pH of the solution was 9.5 instead of 8.0 using a pH meter (Thermo Scientific, Orion 3-Star), followed by stirring at 150 rpm for 10 minutes to prepare the organic-inorganic composition, and the organic-inorganic adhesive composition was left for 48 hours at room temperature and was bar-coated on the top surface of the inorganic material gas barrier layer and cured at 100° C. for 1 minute at high speed to form an organic-inorganic adhesive layer having a thickness of 0.3 μm.

Evaluation Example 1: Evaluation of Physical Properties

The physical properties of the gas barrier films prepared in Examples 1 to 8 and Comparative Examples 1 to 8 were evaluated in the following manner.

(1) pH Measurement

The initial (0 hr) pH of the organic-inorganic adhesive composition used in Examples 1 to 5 and the pH after leaving the organic-inorganic composition at room temperature for 48 hours (48 hr) were measured using a pH meter (Thermo Scientific, Orion 3-Star). The results thereof are shown in Table 1.

(2) Measurement of Adhesive Force Between Organic-Inorganic Adhesive Layer and Inorganic Material Gas Barrier Layer The adhesive force between the organic-inorganic adhesive layer and the inorganic material gas barrier layer of the gas barrier films manufactured by Examples 1 to 8 and Comparative Examples 2 to 4 and 6 to 8 were measured at room temperature and at high temperature and high humidity (60° C., 90% relative humidity, 96 hours), respectively. The adhesive force between the organic-inorganic adhesive layer and the inorganic material gas barrier layer was measured as follows. In accordance with ASTM D3359-02, when a surface of the organic-inorganic adhesive layer is X-cut, a tape is attached, and then peeled off vertically, the peeled area is measured in % based on the total area to which the tape is attached. The adhesive force is shown as 5B (peeling area of 0%), 4B (peeling area of less than 5%), 3B (peeling area of less than 15%), 2B (peeling area of less than 35%), 1B (peeling area of less than 65%), and 0B (peeling area of 65% or higher). The results thereof are shown in Table 2.

(3) Measurement of Adhesive Force Between of Organic-Inorganic Adhesive Layer or Inorganic Material Gas Barrier Layer and Organic Material Layer The adhesive force between the organic-inorganic adhesive layer of the gas barrier films prepared in Examples 1 to 8 or the inorganic material gas barrier layer in the gas barrier film prepared in Comparative Example 1 and the organic material layer was measured. The organic material layer was prepared as follows. UV curable acrylic solution (JSR, OPSTAR Z7535) was bar-coated on top of the organic-inorganic adhesive layer (Examples 1 to 8) or the inorganic material gas barrier layer (Comparative Example 1 of the gas barrier film), and UV cured with an energy of 200 mJ/cm² to form an organic material layer having a thickness of 50 µm. Then, at room temperature and at high temperature and high humidity (60° C., 90% relative humidity, 96 hours), the measurement was performed as described in Section '(2) Measurement of adhesive force between organic-inorganic adhesive layer and inorganic material gas barrier layer'. The results thereof are shown in Table 3.

(4) Measurement of Water Vapor Transmission Rate

The water vapor transmission rates (WVTR) of the gas barrier films prepared in Examples 1 to 8 and Comparative Example 1 were measured. The water vapor transmission rate was measured in a thickness direction of the film under the condition of 38° C. and 100% of relative humidity using MOCON equipment.

TABLE 1

| | pH | |
| --- | --- | --- |
| | 0 hr | 48 hr |
| Example 1 | 8.0 | 7.9 |
| Example 2 | 6.3 | 6.3 |
| Example 3 | 8.0 | 7.9 |
| Example 4 | 8.0 | 7.9 |
| Example 5 | 8.0 | 7.8 |

As shown in Table 1, it was confirmed that the change in pH of the organic-inorganic adhesive composition of Examples 1 to 5 was less than 0.5 even after 48 hours, and the change of the solution over time was small.

TABLE 2

| | Adhesive force | |
| --- | --- | --- |
| | The adhesive force at room temperature | The adhesive force at high temperature and high humidity |
| Example 1 | 5B | 5B |
| Example 2 | 5B | 5B |
| Example 3 | 5B | 5B |
| Example 4 | 5B | 5B |
| Example 5 | 5B | 5B |
| Example 6 | 5B | 5B |
| Example 7 | 5B | 5B |
| Example 8 | 5B | 5B |
| Comparative Example 2 | 2B | 1B |
| Comparative Example 3 | 2B | 0B |
| Comparative Example 4 | 2B | 2B |
| Comparative Example 6 | 2B | 0B |
| Comparative Example 7 | 1B | 1B |
| Comparative Example 8 | 2B | 2B |

As shown in Table 2, it was found that the adhesive force between the organic-inorganic adhesive layer and the inorganic material gas barrier layer of each of the gas barrier films manufactured by Examples 1 to 8 was all improved to 5B under room temperature and at high temperature and high humidity (60° C., 90% of relative humidity, 96 hours).

In contrast, it was found that the adhesive force between the organic-inorganic adhesive layer and the inorganic material gas barrier layer of each of the gas barrier films manufactured by Comparative Examples 2 to 4 and 6 to 8 was all poor as 2B under room temperature and at high temperature and high humidity (60° C., 90% of relative humidity, 96 hours).

TABLE 3

| | Adhesive force | |
| --- | --- | --- |
| | The adhesive force at room temperature | The adhesive force at high temperature and high humidity |
| Example 1 | 5B | 5B |
| Example 2 | 5B | 5B |
| Example 3 | 5B | 5B |
| Example 4 | 5B | 5B |
| Example 5 | 5B | 5B |
| Example 6 | 5B | 5B |
| Example 7 | 5B | 5B |
| Example 8 | 5B | 5B |
| Comparative Example 1 | 0B | 0B |

As shown in Table 2, it was found that the adhesive force between the organic-inorganic adhesive layer and the organic material layer of each of the gas barrier films manufactured by Examples 1 to 8 was all improved to 5B.

In contrast, it was found that the adhesive force between the inorganic material gas barrier layer and the organic material layer of the gas barrier film of Comparative Example 1 was poor as 0B.

TABLE 4

| | Water vapor transmission rate (g/m² · day) |
| --- | --- |
| Example 1 | 0.02 |
| Example 2 | 0.03 |
| Example 3 | 0.02 |
| Example 4 | 0.02 |
| Example 5 | 0.01 |
| Example 6 | 0.02 |
| Example 7 | 0.02 |
| Example 8 | 0.01 |
| Comparative Example 1 | 0.08 |

As shown in Table 4, it was found that the water vapor transmission rates of the gas barrier films manufactured by Examples 1 to 8 were lowered by 37.5% or less, as compared with the gas barrier film manufactured by Comparative Example 1 that does not include an organic-inorganic adhesive layer.

Although the examples of the disclosure have been described in detail as above, the scope of the disclosure is not limited thereto. Various modifications and improvements made by those skilled in the art using the basic concept of the disclosure defined in the following claims also fall within the scope of the disclosure.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A gas barrier film comprising:

a substrate;

an inorganic material gas barrier layer disposed on at least one surface of the substrate; and an organic-inorganic adhesive layer, which is a cured layer derived from an organic-inorganic adhesive composition, on one surface of the inorganic material gas barrier layer, wherein the organic-inorganic adhesive composition comprises:

a silane compound comprising at least one functional group of a vinyl group, an acryloxy group, a methacryloxy group, or a combination thereof;

an amine group-containing compound;

an isocyanate-based compound;

an acid catalyst; and a silane compound having an epoxy group, wherein a pH of the organic-inorganic adhesive composition is from 5 to 8 and a weight ratio of the silane compound having an epoxy group to the silane compound comprising at least one functional group of a vinyl group, an acryloxy group, a methacryloxy group, or a combination thereof is from 1:1 to 1:100.

2. The gas barrier film of claim 1, wherein the amine group-containing compound increases the pH of the organic-inorganic adhesive composition from 2 to 6.

3. The gas barrier film of claim 1, wherein the organic-inorganic adhesive composition has a change in pH of 0.5 or less for 48 hours.

4. The gas barrier film of claim 1, wherein the silane compound comprises a $C_1$-$C_{10}$ alkoxy silane compound.

5. The gas barrier film of claim 1, wherein a content of the silane compound is from 0.01 percent by weight (wt %) to 10 wt %, based on a total weight of the organic-inorganic adhesive composition.

6. The gas barrier film of claim 1, wherein the organic-inorganic adhesive composition is cured within 2 minutes at a temperature of 100° C. or less.

7. The gas barrier film of claim 1, further comprising an organic material layer on one surface of the organic-inorganic adhesive layer.

8. The gas barrier film of claim 7, wherein the organic-inorganic adhesive layer forms a radical bond with the organic material layer.

9. The gas barrier film of claim 1, wherein a thickness of the organic-inorganic adhesive layer is from 0.01 micrometers (μm) to 10 μm.

10. The gas barrier film of claim 1, wherein the gas barrier film reduces a water vapor transmission rate by 10% or more, as compared with a gas barrier film that does not comprise an organic-inorganic adhesive layer.

* * * * *